US008569183B2

(12) United States Patent
Purtell (10) Patent No.: US 8,569,183 B2
(45) Date of Patent: Oct. 29, 2013

(54) LOW TEMPERATURE DIELECTRIC FLOW USING MICROWAVES

(75) Inventor: Robert J. Purtell, West Jordan, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 78 days.

(21) Appl. No.: 13/035,653

(22) Filed: Feb. 25, 2011

(65) Prior Publication Data

US 2011/0212627 A1  Sep. 1, 2011

Related U.S. Application Data

(60) Provisional application No. 61/309,128, filed on Mar. 1, 2010.

(51) Int. Cl.
*H01L 21/31* (2006.01)
(52) U.S. Cl.
USPC ............ 438/760; 438/758; 438/778; 438/788
(58) Field of Classification Search
None
See application file for complete search history.

(56) References Cited

U.S. PATENT DOCUMENTS

| 4,737,379 | A | * | 4/1988 | Hudgens et al. ............. 427/575 |
| 4,785,763 | A | * | 11/1988 | Saitoh ................... 118/723 MW |
| 5,030,476 | A | * | 7/1991 | Okamura et al. ............. 427/575 |
| 5,514,217 | A | * | 5/1996 | Niino et al. ............ 118/723 MW |
| 5,637,358 | A | * | 6/1997 | Otoshi et al. .................... 427/575 |
| 5,643,365 | A | * | 7/1997 | Blinov et al. ......... 118/723 MW |
| 6,200,651 | B1 | * | 3/2001 | Roche et al. ................... 427/571 |
| 7,589,028 | B1 | * | 9/2009 | Cho et al. ...................... 438/778 |
| 2003/0152700 | A1 | * | 8/2003 | Asmussen et al. ......... 427/249.8 |
| 2004/0023140 | A1 | * | 2/2004 | Kawamura et al. ............. 430/66 |
| 2004/0238104 | A1 | | 12/2004 | Suzuki et al. |
| 2005/0156285 | A1 | | 7/2005 | Gates et al. |
| 2010/0079203 | A1 | * | 4/2010 | Furutani ....................... 327/564 |

FOREIGN PATENT DOCUMENTS

TW  415009 B  12/2000

OTHER PUBLICATIONS

Taiwan Intellectual Property Office, Search Report dated Aug. 27, 2013 for Taiwan Application No. 100106787.

* cited by examiner

*Primary Examiner* — Scott B Geyer
(74) *Attorney, Agent, or Firm* — Kenneth E. Horton; Kirton McConkie (57) ABSTRACT

Semiconductor devices and methods for making such devices are described. The semiconductor devices contain dielectric layers that have been deposited and/or flowed by the application of microwave energy ("MW dielectric layers"). The dielectric layers can be made by providing a substrate in a reaction chamber, flowing a precursor gas mixture (containing atoms that react to form a dielectric material) in the reaction chamber, and then subjecting the gas mixture to microwave energy at a frequency and power density sufficient to cause the atoms of the precursor gas mixture to react and deposit to form a dielectric layer on the substrate. As well, the devices can be made by applying microwave energy to an already-deposited dielectric film at a frequency and power density sufficient to cause the atoms of the deposited dielectric material to flow. Using microwave energy permits the dielectric layer to be formed using low temperature processing, providing several benefits to the semiconductor device along with process flow efficiency and low cost. Other embodiments are described.

34 Claims, 5 Drawing Sheets

FIGURE 7

LOW TEMPERATURE DIELECTRIC FLOW USING MICROWAVES

CROSS-REFERENCE TO RELATED APPLICATION

This patent application claims priority of U.S. Provisional Application Ser. No. 61/309,128, filed on Mar. 1, 2010, the entire disclosure of which is hereby incorporated by reference.

FIELD

This application relates generally to semiconductor devices and methods for making such devices. More specifically, this application describes semiconductor devices containing dielectric layers deposited and/or flowed by microwaves at low processing temperatures.

BACKGROUND

Semiconductor devices containing integrated circuits (ICs) or discrete devices are used in a wide variety of electronic apparatus. The IC devices (or chips, or discrete devices) comprise a miniaturized electronic circuit that has been manufactured in the surface of a substrate of semiconductor material. The circuits are composed of many overlapping layers, including layers containing dopants that can be diffused into the substrate (called diffusion layers) or ions that are implanted (implant layers) into the substrate. Other layers are conductors (polysilicon or metal layers) or connections between the conducting layers (via or contact layers). IC devices or discrete devices can be fabricated in a layer-by-layer process that uses a combination of many steps, including growing layers, imaging, deposition, etching, doping and cleaning. Silicon wafers are typically used as the substrate and photolithography is used to mark different areas of the substrate to be doped or to deposit and define polysilicon, insulators, or metal layers.

One of these layers is an insulating layer that is often made of dielectric materials. In some instances, the insulating layer can be made by depositing a precursor gas mixture of the desired dielectric material in a vacuum chamber or plasma-enhanced vacuum chamber followed by densification and flow of the deposited dielectric material in a furnace at a high temperature of about 950 to 1000° C. for about 5 to 6 hours.

SUMMARY

This application describes semiconductor devices and methods for making such devices. The semiconductor devices contain dielectric layers that have been deposited and/or flowed by the application of microwave energy ("MW dielectric layers"). The dielectric layers can be made by providing a substrate in a reaction chamber, flowing a precursor gas mixture (containing atoms that react to form a dielectric material) in the reaction chamber, and then subjecting the gas mixture to microwave energy at a frequency and power density sufficient to cause the atoms of the precursor gas mixture to react and deposit to form a dielectric layer on the substrate. As well, the devices can be made by applying microwave energy to an already-deposited dielectric film at a frequency and power density sufficient to cause the atoms of the deposited dielectric material to flow. Using microwave energy permits the dielectric layer to be formed using low temperature processing, providing several benefits to the semiconductor device along with process flow efficiency and low cost.

BRIEF DESCRIPTION OF THE DRAWINGS

The following description can be better understood in light of the Figures, in which.

The Figures illustrate specific aspects of the semiconductor devices and methods for making such devices. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the semiconductor devices and associated methods of making and using the devices can be implemented and used without employing these specific details. Indeed, the semiconductor devices and associated methods can be placed into practice by modifying the illustrated devices and methods and can be used in conjunction with any other apparatus and techniques conventionally used in the industry. For example, while the description refers to CMOS, UMOS, and LDMOS semiconductor devices, it could be modified for other types of semiconductor devices. As well, while the description refers to semiconductor devices, it could be modified for other devices containing dielectric layers, such as solar cells or MEMS devices.

Some embodiments of the semiconductor devices and methods for making such devices include the formation of a dielectric layer using microwave energy. The MW dielectric layers can be made by flowing a precursor gas mixture (containing atoms that can react to form a dielectric material) in a reaction chamber containing a substrate, and then subjecting the gas mixture to microwave (MW) energy at a frequency and power density sufficient to cause the atoms of the precursor gas mixture to react and deposit to form a dielectric layer on the substrate. As well, the MW dielectric layers can be made by applying microwave energy to an already-deposited dielectric film (whether or not originally formed using MW energy) at a frequency and power density sufficient to cause the atoms of the deposited dielectric material to flow. The dielectric layer can be formed on any underlying surface or substrate known in the art, including a semiconductor material (like a silicon wafer), another insulating layer (like silicon oxide), or a conducting layer (like a polysilicon gate layer). The substrate may be doped or un-doped with any desired dopant or combination of dopants.

The dielectric layer can be made of any dielectric material that can be heated and/or flowed by the microwave energy, yet also be used as an insulating layer in semiconductor devices. In some embodiments, the dielectric material can be silicon oxides, silicon nitrides, aluminum oxides, polyimides, spin-on-glass (SOG) materials, fluorinated polyimides, diamond-like carbon (DLC) materials, polyarylene ethers, polyarylenes, cyclotenes, parylene N, polynorbornes, polyimide-SSQ hybrids, alkyl-silanes/$N_2O$, teflon-AF, teflon microemulsion, polyimide nanofoams, silica aerogels, silica xerogels, mesoporous silica, or combinations of these materials. In other embodiments, the dielectric material can be Black Diamond™ or Coral™ CVD films.

The precursor gas mixture used to form the dielectric layer can be any gas mixture containing the atoms that react together to form the desired dielectric material. In the embodiments where the dielectric layer is silicon oxide, the precursor gas mixture can comprise any mixture of silicon-containing gases, oxygen-containing gases, gases containing silicon and oxygen, carbon-containing gases, as well as inert gases, gases containing the agents described herein, or combinations thereof. For example, when the dielectric layer is a BPSG layer, the precursor gas mixture comprises $PH_3$, silane, $N_2O$, and $B_2H_6$ which react under PECVD conditions (with a pressure of 2.4 Torr) to form BPSG. As another example, when the dielectric layer comprises BPTEOS, the precursor gas mixture can comprise TEPO, TEOS, Ozone, and TEB, which react under SACVD conditions (with a pressure of 200 Torr) to form a BPTEOS layer, which can be used as a conformal film for filling trenches with high aspect ratios. In the embodiments where the dielectric layer comprises Black Diamond™ or Coral™, the precursor gas mixture can contain organosilane precursors along with gaseous oxidizers such as $O_2$ or $N_2O$.

The microwave heating process can use any frequency or wavelength of microwaves that are allowed for industrial applications by government regulations. In some embodiments, the frequency of the microwaves can range from about 2.45 GHz to about 5.8 GHz and have a wavelength ranging from about 52 mm to about 123 mm. The microwave heating process can be performed for any time sufficient to form the dielectric layer to the desired thickness. In some embodiments, the time can range up to about 120 minutes, which is much shorter than the 5 to 6 hours that are often required for conventional furnace processes. In some embodiments, the time can range from about 10 minutes to about 120 minutes. In other embodiments, the time can range from about 15 minutes to about 60 minutes. In yet other embodiments, the time can be any suitable combination or sub-range of these times.

The microwave heating process can be performed for any temperature sufficient to deposit and/or flow the dielectric layer. In some embodiments, the temperature can be less than about 800° C. In other embodiments, the temperatures can range from about 400 to about 800° C. In yet other embodiments, the temperatures can range from about 500 to about 600° C. In still other embodiments, the time can be any suitable combination or sub-range of these temperatures.

Figure 4:
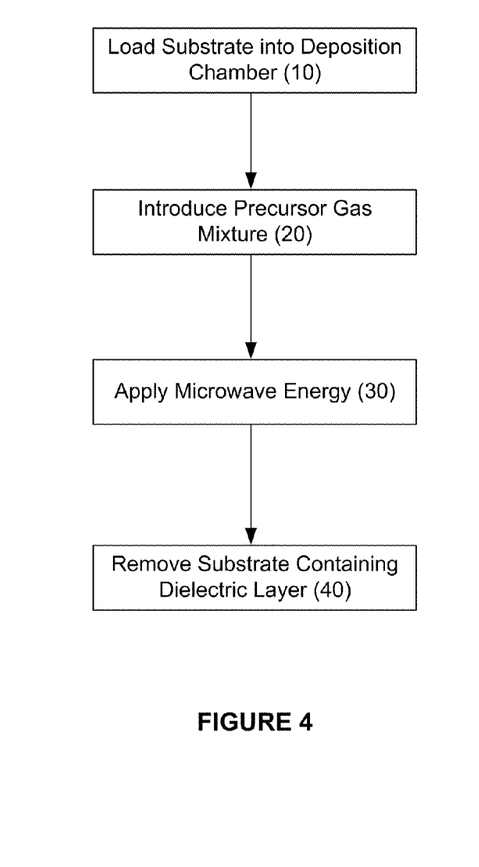
FIG. 4 shows some embodiments of a process for depositing a dielectric layer using microwave energy.

Some embodiments of a process that can be used to form the MW dielectric layers are depicted in FIG. 4. In these embodiments, a dielectric layer can be deposited using MW energy. A substrate can be provided and loaded into a deposition chamber, as shown in box 10. If needed, the deposition chamber can be purged with a purge gas. The desired precursor gas mixture is then introduced into the chamber, as shown in box 20. MW energy as described herein is then used to heat the gas mixture, as shown in box 30, causing the desired dielectric material to deposit on the substrate. If needed, the deposition chamber can be purged with a purge gas and the substrate containing the dielectric layer can then be removed from the deposition chamber, as shown in box 40.

Figure 5:
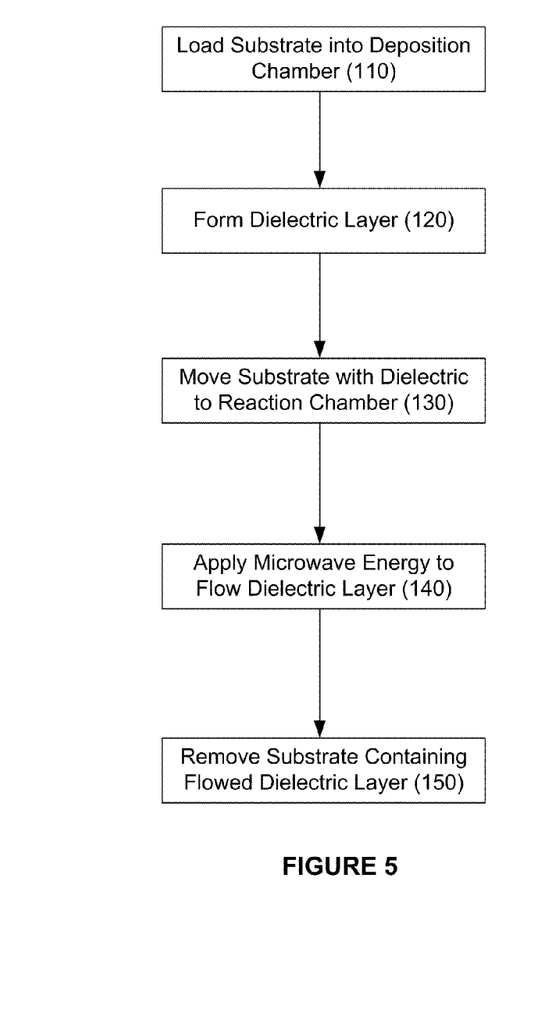
FIG. 5 shows some embodiments of a process for flowing a dielectric layer using microwave energy.

Other embodiments of a process that can be used to form the MW dielectric layers are depicted in FIG. 5. In these embodiments, the microwave energy can be applied to dielectric layers that have already been formed by any known method. The microwave energy causes the pre-formed dielectric layer to flow, yielding the features of a flowed dielectric layer formed by microwave energy. In these embodiments, a substrate can be loaded into a deposition chamber, shown in box 110. The dielectric layer (such as a BPTEOS or BPSG layer) could be formed on the substrate using any deposition process known in the art in the deposition chamber that does not use microwave energy or by growing the dielectric layer, as shown in box 120. The substrate with the pre-formed dielectric layer could then be transferred through air to a microwave reaction chamber by using desiccators to prevent any moisture from contacting the film, as shown in box 130. In other configurations, the transfer from the deposition chamber to the reaction chamber can be performed in a vacuum or using an inert gas (such as $N_2$) to avoid contact with air that contains moisture. This moisture can induce $BPO_4$ formation and crystal formation. The pre-formed dielectric layer can then be heated in the microwave reaction chamber, as shown in box 140 causing the deposited dielectric layer to flow as described herein. Once the pre-formed dielectric layer has been flowed using the MW energy, the substrate containing the flowed dielectric layer can then be removed from the microwave reaction chamber, as shown in box 150.

Figure 6:
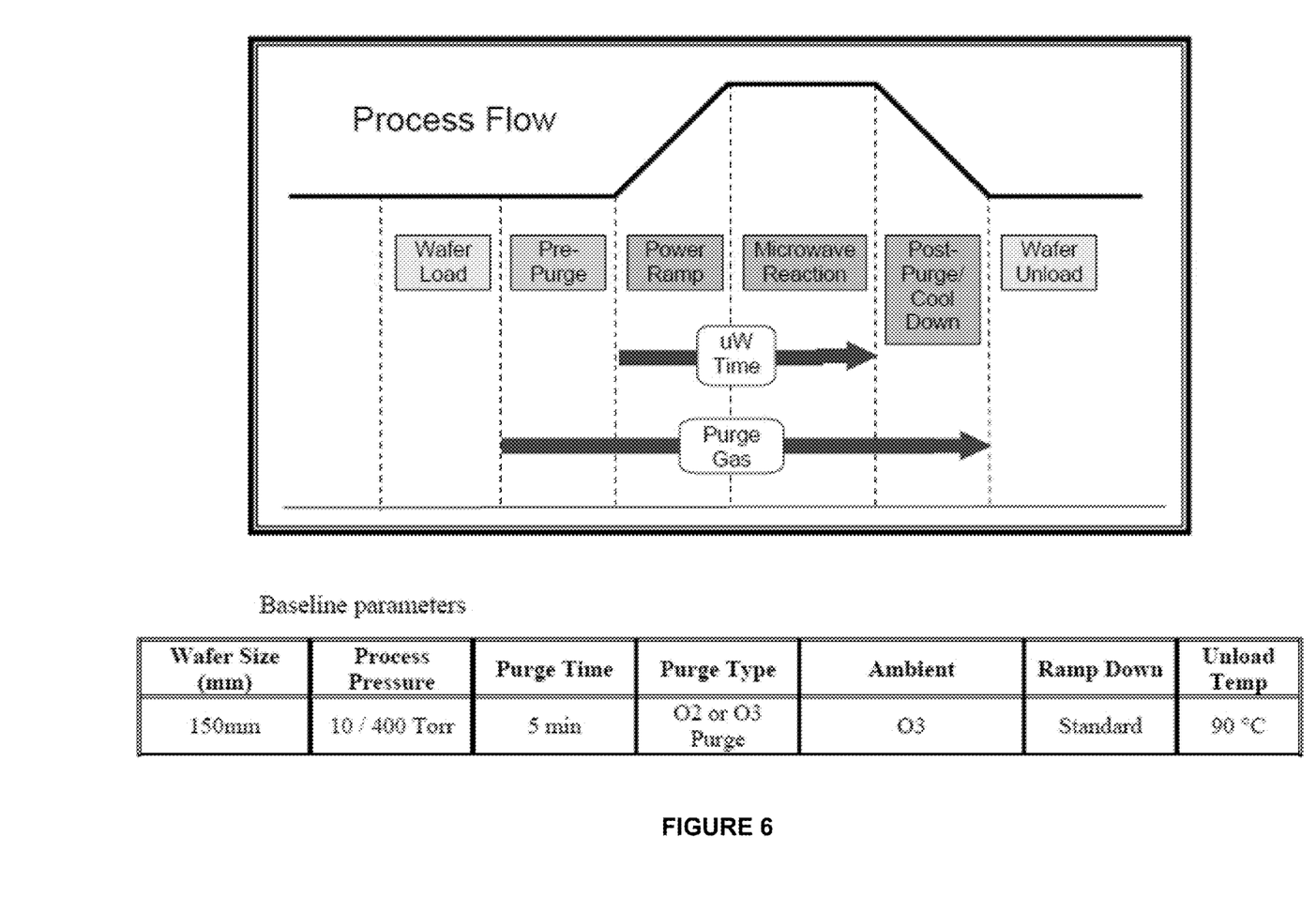
FIG. 6 shows some embodiments of a process for depositing and flowing a dielectric layer using microwave energy.
Figure 7:
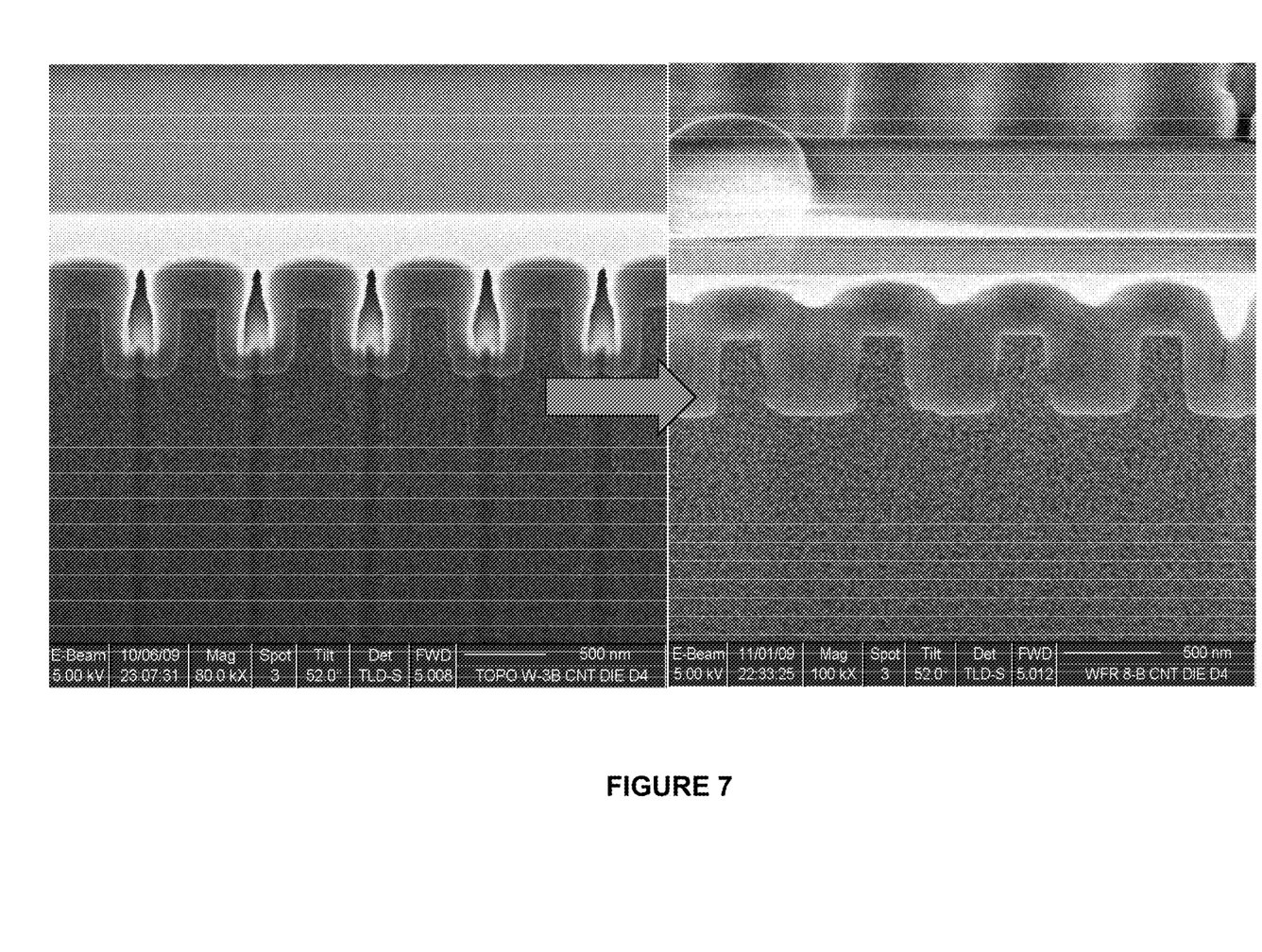
FIG. 7 shows a SEM photograph of some embodiments of MW dielectric layers.

In yet other embodiments a process that can be used to form the MW dielectric layers by combining the above methods. In other words, the dielectric layer can first be deposited using MW energy in a chamber and then flowed using MW energy in the same chamber. One example of these embodiments is illustrated in FIG. 6, where the vertical axis represents temperature and the horizontal axis represents time. In these embodiments, both the deposition process and the flowing process can be conducted in the same chamber as an in-situ process to form the dielectric layer. The microwave energy allows both the deposition of the dielectric film, as well as densification and flow in the same chamber. By performing this as an in-situ process in a single chamber, the substrate with the dielectric layer does not need to be moved from a deposition chamber to a reaction chamber.

In some embodiments, the dielectric layer can be deposited and/or flowed on a wafer in a vacuum or plasma-enhanced vacuum chamber using microwave energy until the dielectric layer is formed to the desired thickness. In other embodiments, such as with spin on dielectric deposition, the microwaves may be applied during or after film deposition. The thickness of the dielectric layer can range from about 0.5 μm to about 10 μm. In some embodiments, the MW energy can flow thicker dielectric layers (i.e., those with a thickness ranging from about 0.5 μm to about 5 μm) better than thinner layers (i.e., those with a thickness ranging from about 0.1 μm to about 0.5 μm) because, it is believed, of the mode in which the MW energy heats the dielectric material or due to hydrodynamic effects present in a thicker film.

In some embodiments, the flow and deposition of the dielectric layer can be enhanced by adding agents that lower the glass transition temperature (GTT) of the dielectric material. Such GTT agents include any elements that lower the GTT and which can be used as dopants in semiconductor devices. In some embodiments, B can be used as the GTT agent. In some embodiments, the amount of the GTT agent can range up to about 6 wt %. In some embodiments, the amount of the GTT agent can range up to about 4 wt %.

In other embodiments, the flow and deposition of the dielectric layer can be enhanced by adding agents that increase the adsorption of the microwave energy by the dielectric material and make it easier to heat. Such adsorption agents include any elements that increase the MW energy adsorption and which can be used as dopants in semiconductor devices, including C, B, P, or As. In some embodiments, P can be used as the adsorption agent. In some embodiments, the amount of the adsorption agent can range up to about 7 wt %. In other embodiments, the amount of the adsorption agent can range up to about 5 wt %. The improvement added by using B as a GTT agent and P as an adsorption agent can be seen in trench structures where the dielectric layers with these agents fills the trenches better than dielectric layers which do not contain these agents, as illustrated in FIG. 6.

Figure 1:
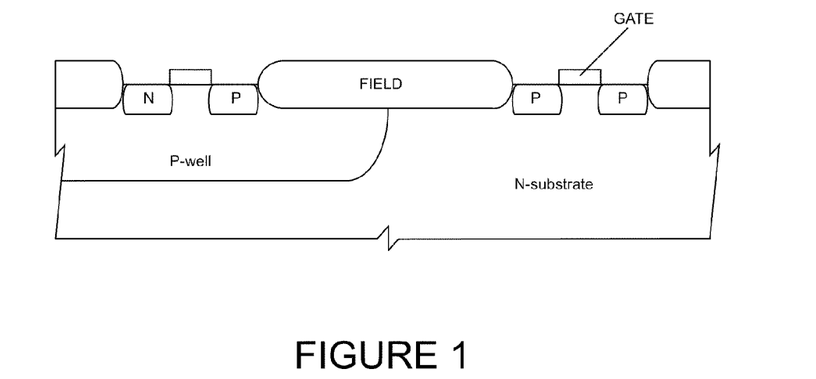
FIG. 1 shows some embodiments of a CMOS semiconductor structure.

The dielectric layers formed and/or flowed using MW energy can be used in any number of semiconductor devices to give specific benefits because of the features exhibited by these dielectric layers. Examples of such semiconductor devices include metal-oxide-semiconductor (MOS) devices, such as CMOS, UMOS, LDMOS, bipolar, BiCMOS, or solar cell devices. In some embodiments, the MW dielectric layers can be used in CMOS devices. An example of a CMOS device is illustrated in FIG. 1. In CMOS devices, the MW dielectric layer can be a carbon-containing dielectric layer with a lower dielectric constant, producing a CMOS device with a high switching speed.

Figure 2:
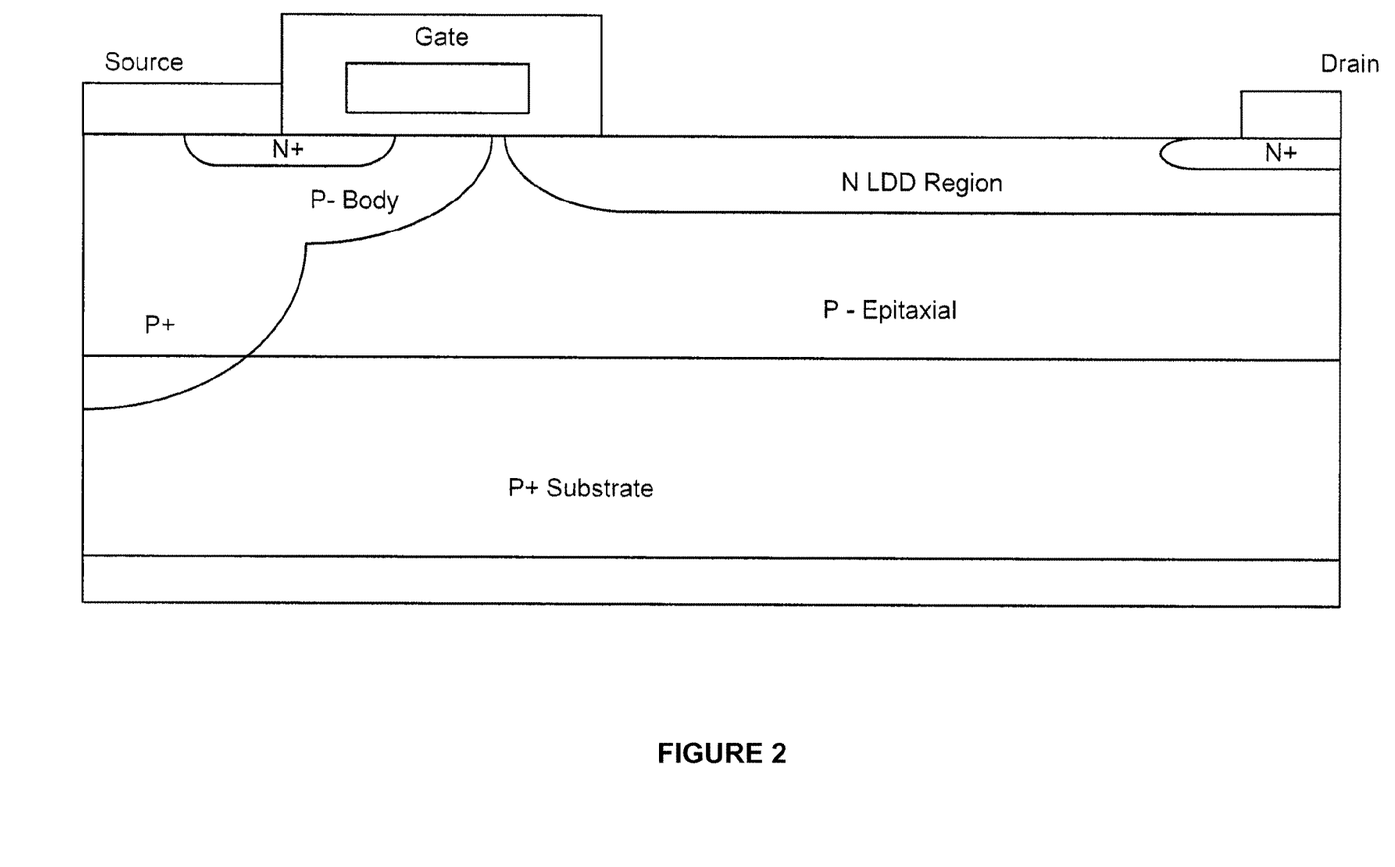
FIG. 2 depicts some embodiments of an LDMOS semiconductor structure.
Figure 3:
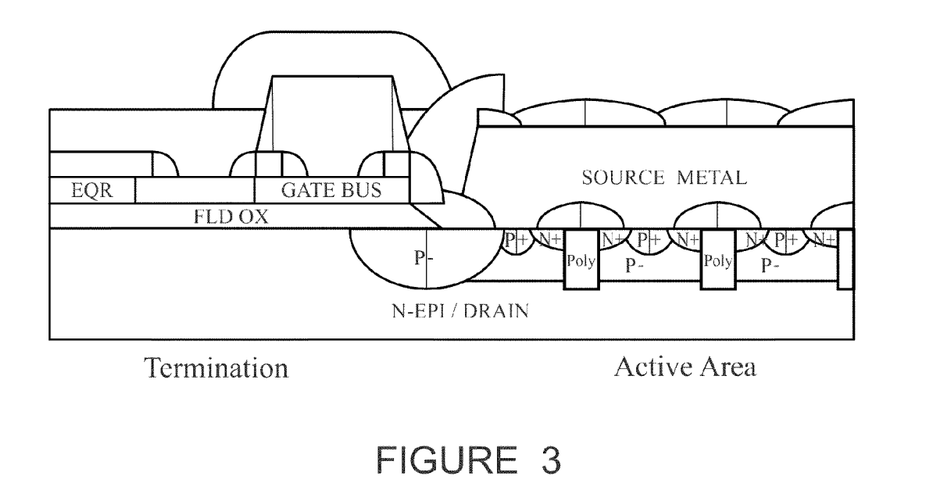
FIG. 3 shows some embodiments of a UMOS semiconductor structure.

In other embodiments, the MW dielectric layers can be used in LDMOS devices. An example of a LDMOS device is illustrated in FIG. 2. In yet other embodiments, the MW dielectric layers can be used in UMOS devices. An example of a UMOS device is illustrated in FIG. 3. In both of the UMOS and LDMOS devices, the MW dielectric layers can reduce or eliminate the $BPO_4$ crystals that can form at high temperatures. These crystals can cause etching non-uniformity and lead to poor contact of the heavy body regions to the source as well as subsequent UIL failures, especially as device dimensions shrink to the 0.25 μm dimensions. In both of these devices, the MW dielectric layers can also reduce silicide agglomeration and migration below the source boundary at the high temperatures which they would experience in a conventional furnace process operating at 900-1000° C.

As well, in LDMOS devices the MW dielectric layers can be a carbon-containing dielectric layer with a lower dielectric constant, producing a LDMOS device with a high switching speed. In LDMOS devices, the MW dielectric layers also produce an increased uniform planarization of the dielectric layers between the polysilicon gates. These MW dielectric layers can also reduce the number of dummy structures used between polysilicon gate lines which can be needed to prevent etching of the dielectric layer down to the Si mesa structure. Thus, the MW dielectric layers can also reduce the subsequent unwanted siliciding of the Si mesa structures. And the MW dielectric layers can reduce die size and die cost in LDMOS devices due to the reduced area needed for dummy structures. In LDMOS devices, the MW dielectric layers can also eliminate or reduce seam formations along with the resulting voids in the dielectric layer, which can cause shorts and solvent trapping in the voids.

The MW flowed or cured dielectric layers have several desirable features. First, relative to conventional furnace processes, they have an improved through-put and yield with a lower thermal budget. The lower thermal budget can reduce the manufacturing costs of the semiconductor devices containing the MW dielectric layers. The lower thermal budget also allows low temperature materials to be used which typically could not otherwise survive the higher temperatures used in conventional furnaces. Examples of these low temperature materials include silicides, such as $CoSi_2$ or $TiSi_2$, low-K gate dielectric materials such as fluorine-doped oxides, Black Diamond™ or Coral™ materials, spin on dielectric (SOG) materials, high-K gate conductors (including polysilicon or amorphous Si gate materials), or combinations thereof. These silicide materials and the high-K gate conductors are formed in a processing step prior to the formation of MW dielectric layers. The silicide materials and the high-K gate conductors do not have to be subjected to a high temperature furnace flow or reflow process because the MW dielectric layers formed later using low temperature MW energy.

The lower temperatures also allow for a wider process window for silicides. As known in the art, the resistance of silicide layers increases when higher temperatures (such as those in conventional furnace processes) are used during formation of the silicides. The increased resistance and thermal stability problems from high temperature processing may be reduced by increasing the silicide thickness, which is now possible in device configurations using the MW dielectric layer since the thicker silicide can be contained within the trench gate away from the source body contact so as to not cause leakage or $V_t$ shift problems.

This low temperature ability becomes even more important as device dimensions shrink in semiconductor devices. As dimensions shrink, tighter pitch devices and more complex device stacks are needed. Greater process controls are needed to obtain these features, which can be obtained using MW dielectric layers because of their features described in this application.

Yet another desirable feature resulting from the MW dielectric layer is the ability to re-flow the dielectric layer at low temperature, if necessary. Often, with certain types of dielectric layers, they need to be re-flowed in order to be used in semiconductor devices because the reflow process gives them the desired insulating properties. But when formed using microwave energy, a re-flow process may not be needed to obtain the desired characteristics of the dielectric layer. This ability of the MW dielectric layers to flow (and re-flow) can be seen when gas bubbles escape from a seam formed during deposition of the dielectric layer in and on a trench structure, as well as by using atomic force microscopy which can show evidence of the flow of the dielectric layer after MW energy has been used.

Another desirable feature is that because of the ability of the microwave energy to flow the dielectric materials, the MW dielectric layers contain a high degree of planarity. Thus, post planarization processes that are conventionally used after the dielectric layer has been flowed, such as chemical mechanical polishing (CMP) or a planarizing etch, can be avoided in certain configurations of the semiconductor device. These planarization processes can add expense and can cause contamination because of the materials used in the planarization processes.

Another desirable feature of the MW dielectric layer is the ability of the flowing process to fill in voids in the dielectric layers. Other dielectric layers, especially those formed in trenches, can sometimes be formed with voids (and sometimes trapped gases) in the layers, which can detract from the ability of the dielectric layer to operate efficiently as an insulator. It is believed that the microwave energy causes rotational excitation at a molecular level, rather than a vibrational coupling, resulting in heating of the insulating material and the formation of fewer voids in the dielectric material of the layer.

Yet another desirable feature of the MW dielectric layer is the increased density when compared to dielectric layers formed without microwave energy. This increased density of the MW dielectric layer results, it is believed, from the rotational heating experienced by the molecules when subjected to MW energy when deposited or flowed. The increased density of the MW dielectric layer also results, it is believed, from the reaction of the background gases that are in the precursor gas mixture, such as $N_2$, $O_2$, and other gases used to assist dielectric flow in conventional RTP.

It is understood that all material types provided herein are for illustrative purposes only. Accordingly, one or more of the various dielectric layers in the embodiments described herein may comprise low-k or high-k dielectric materials. As well, while specific dopants are names for the n-type and p-type dopants, any other known n-type and p-type dopants (or combination of such dopants) can be used in the semiconductor devices. As well, although the devices of the invention are described with reference to a particular type of conductivity (P or N), the devices can be configured with a combination of the same type of dopant or can be configured with the opposite type of conductivity (N or P, respectively) by appropriate modifications.

In some embodiments, this application relates to a dielectric layer made by the method comprising providing a substrate in a deposition chamber, providing a precursor gas mixture in the deposition chamber, the precursor gas mixture containing atoms that react to form a dielectric material, and providing microwave energy at a frequency sufficient to cause the atoms of the precursor gas mixture to react and deposit a dielectric layer on the substrate.

In other embodiments, this application relates to a dielectric layer made by the method comprising providing a substrate in a deposition chamber, forming a dielectric layer on the substrate in the deposition chamber, moving the substrate with the dielectric layer into a reaction chamber, and providing microwave energy at a frequency sufficient to cause the dielectric layer to flow.

In some embodiments, this application relates to a semiconductor device, comprising a substrate, a low-temperature silicide layer or high-K conducting layer formed on a portion of the substrate, and a dielectric layer formed on a portion of the low-temperature silicide layer or high-K conducting layer, the dielectric layer being deposited or flowed using low temperature MW energy.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A method for making a dielectric layer, comprising:
    providing a substrate in a deposition chamber, wherein the upper surface of the substrate comprises a silicide-containing conductive material, a semiconductor material, or an insulating material;
    providing a precursor gas mixture in the deposition chamber, the precursor gas mixture containing atoms that react to form a dielectric material; and
    providing microwave energy at a frequency sufficient to cause the atoms of the precursor gas mixture to react and deposit a BPTEOS or BPSG dielectric layer on a portion of the substrate.

2. The method of claim 1, wherein the time for the reaction ranges up to about 120 minutes.

3. The method of claim 1, wherein the dielectric layer comprises a low-k gate dielectric material.

4. The method of claim 1, wherein the temperature in the deposition chamber when the microwave energy is provided ranges up to about 800° C.

5. The method of claim 1, wherein the dielectric layer comprises a GTT agent, an adsorption agent, or both.

6. The method of claim 5, wherein the GTT agent comprises B and the adsorption agent comprises P.

7. A method for making a dielectric layer, comprising:
    providing a substrate in a deposition chamber;
    forming a dielectric layer on a portion of the substrate in the deposition chamber;
    moving the substrate with the dielectric layer into a reaction chamber; and
    providing microwave energy at a frequency sufficient to cause the dielectric layer to flow.

8. The method of claim 7, wherein the upper surface of the substrate comprises a conductive material, a semiconductor material, or an insulating material.

9. The method of claim 8, wherein the conductive material comprises a silicide.

10. The method of claim 7, wherein the time for the reaction ranges up to about 120 minutes.

11. The method of claim 7, wherein the dielectric layer is BPTEOS or BPSG.

12. The method of claim 7, wherein the dielectric layer comprises a low-k gate dielectric material.

13. The method of claim 7, wherein the dielectric layer comprises a GTT agent, an adsorption agent, or both.

14. The method of claim 13, wherein the GTT agent comprises B and the adsorption agent comprises P.

15. A method for making a dielectric layer, comprising:
    providing a substrate in a chamber;
    providing a precursor gas mixture in the chamber, the precursor gas mixture containing atoms that react to form a dielectric material;
    providing microwave energy at a frequency sufficient to cause the atoms of the precursor gas mixture to react and deposit a dielectric layer on a portion of the substrate; and
    while in the same chamber, providing microwave energy at a frequency sufficient to cause the dielectric layer to flow.

16. The method of claim 15, wherein the time for the reaction ranges up to about 120 minutes.

17. The method of claim 15, wherein the temperature in the reaction chamber when the microwave energy is provided ranges up to about 800° C.

18. The method of claim 15, wherein the dielectric layer comprises BPTEOS or BPSG.

19. The method of claim 15, wherein the dielectric layer comprises a low-k gate dielectric material.

20. The method of claim 15, wherein the dielectric layer comprises a GTT agent, an adsorption agent, or both.

21. A method for making a dielectric layer, comprising:
providing a substrate in a deposition chamber wherein the upper surface of the substrate comprises a silicide-containing conductive material, a semiconductor material, or an insulating material;
providing a precursor gas mixture in the deposition chamber, the precursor gas mixture containing atoms that react to form a dielectric material comprising silicon oxides, silicon nitrides, aluminum oxides, polyimides, spin-on-glass (SOG) materials, fluorinated polyimides, polyarylene ethers, polyarylenes, cyclotenes, parylene N, polynorbornes, polyimide-SSQ hybrids, alkyl-silanes/$N_2O$, amorphous fluoroplastics, polytetrafluoroethylene microemulsion, polyimide nanofoams, silica aerogels, silica xerogels, mesoporous silica, or low-k gate dielectric materials; and
providing microwave energy at a frequency sufficient to cause the atoms of the precursor gas mixture to react and deposit a dielectric layer comprising a GTT agent, an adsorption agent, or both on a portion of the substrate.

22. The method of claim 21, wherein the time for the reaction ranges up to about 120 minutes.

23. The method of claim 21, wherein the temperature in the deposition chamber when the microwave energy is provided ranges up to about 800° C.

24. The method of claim 21, wherein the GTT agent comprises B and the adsorption agent comprises P.

25. A method for making a dielectric layer, comprising:
providing a substrate in a deposition chamber, wherein the upper surface of the substrate comprises a silicide-containing conductive material, a semiconductor material, or an insulating material;
providing a precursor gas mixture in the deposition chamber, the precursor gas mixture containing atoms that react to form a dielectric material; and
providing microwave energy at a frequency sufficient to cause the atoms of the precursor gas mixture to react and deposit a dielectric layer comprising a GTT agent, an adsorption agent, or both on a portion of the substrate.

26. The method of claim 25, wherein the dielectric layer comprises a low-k gate dielectric material.

27. The method of claim 25, wherein the temperature in the deposition chamber when the microwave energy is provided ranges up to about 800° C.

28. The method of claim 25, wherein the GTT agent comprises B and the adsorption agent comprises P.

29. A method for making a dielectric layer in a semiconductor device, comprising:
providing a MOS semiconductor device containing a substrate in a deposition chamber, wherein the upper surface of the substrate comprises a silicide-containing conductive material, a semiconductor material, or an insulating material;
providing a precursor gas mixture in the deposition chamber, the precursor gas mixture containing atoms that react to form a dielectric material; and
providing microwave energy at a frequency sufficient to cause the atoms of the precursor gas mixture to react and deposit a BPTEOS or BPSG dielectric layer on a portion of the substrate.

30. The method of claim 29, wherein the dielectric layer comprises a low-k gate dielectric material.

31. The method of claim 29, wherein the temperature in the deposition chamber when the microwave energy is provided ranges up to about 800° C.

32. The method of claim 29, wherein the dielectric layer comprised a GTT agent, an adsorption agent, or both.

33. The method of claim 32, wherein the GTT agent comprises B and the adsorption agent comprises P.

34. The method of claim 29, wherein the MOS semiconductor device is a CMOS, UMOS, LDMOS, bipolar, or BiCMOS device.

* * * * *